United States Patent
Liu et al.

(10) Patent No.: US 6,753,506 B2
(45) Date of Patent: Jun. 22, 2004

(54) SYSTEM AND METHOD OF FAST AMBIENT SWITCHING FOR RAPID THERMAL PROCESSING

(75) Inventors: Yong Liu, Lynnfield, MA (US); Jeffrey P. Hebb, Boston, MA (US); William Francis Drislane, Pepperell, MA (US)

(73) Assignee: Axcelis Technologies, Beverly, MA (US)

( * ) Notice: Subject to any disclaimer, the term of this patent is extended or adjusted under 35 U.S.C. 154(b) by 147 days.

(21) Appl. No.: 09/938,257

(22) Filed: Aug. 23, 2001

(65) Prior Publication Data

US 2003/0038127 A1 Feb. 27, 2003

(51) Int. Cl.⁷ .................................................. F27B 5/14
(52) U.S. Cl. ........................ 219/390; 219/405; 219/411; 118/724; 118/725; 118/50.1; 118/729; 118/730; 392/416; 392/418
(58) Field of Search ................................ 219/390, 405, 219/411; 392/416, 418; 118/724, 725, 50.1, 729–730

(56) References Cited

U.S. PATENT DOCUMENTS

| | | | |
|---|---|---|---|
| 4,857,689 A | | 8/1989 | Lee .......................... 219/10.71 |
| 5,038,711 A | * | 8/1991 | Dan et al. .................... 118/715 |
| 5,728,224 A | * | 3/1998 | Laurent et al. ............. 118/718 |
| 5,730,801 A | * | 3/1998 | Tepman et al. ............. 118/719 |
| 5,891,251 A | * | 4/1999 | MacLeish et al. .......... 118/719 |
| 5,900,177 A | * | 5/1999 | Lecouras et al. ............ 219/497 |
| 5,991,508 A | * | 11/1999 | Ohmine et al. ............. 392/418 |
| 6,111,225 A | | 8/2000 | Ohkase et al. .............. 219/390 |
| 6,113,984 A | * | 9/2000 | MacLeish et al. ..... 427/255.32 |
| 6,133,550 A | | 10/2000 | Griffiths et al. ............. 219/403 |
| 6,159,298 A | | 12/2000 | Saito .......................... 118/715 |
| 6,173,116 B1 | | 1/2001 | Roozeboom et al. ....... 392/416 |
| 6,183,127 B1 | | 2/2001 | Hebb et al. ..................... 374/9 |
| 6,231,674 B1 | * | 5/2001 | Chen et al. ................. 118/720 |
| 6,293,696 B1 | * | 9/2001 | Guardado ....................... 374/2 |

* cited by examiner

Primary Examiner—Shawntina Fuqua
(74) Attorney, Agent, or Firm—Lahive & Cockfield, LLP; Anthony A. Laurentano, Esq.; Sean D. Detweiler, Esq.

(57) ABSTRACT

A method and apparatus for thermal processing of a workpiece reduces the time taken for a processing gas to be purged, or switched, during one or more processing steps for thermal processing systems. The thermal processing system includes a heating chamber in accordance with one example embodiment of the present invention. A small-volume workpiece enclosure is disposed about the workpiece. A translation mechanism, e.g., in the form of a positioning assembly, supports the small-volume workpiece enclosure for moving the small-volume workpiece enclosure and the workpiece within the heating chamber. The small-volume workpiece enclosure enables the use of relatively smaller amounts of process (ambient) gases, and decreases the purge time of such gases. The heating chamber can have at least one of a thermal radiation intensity gradient and a temperature gradient for thermally processing the workpiece. The heating chamber can have one or more heating elements disposed about the heating chamber.

49 Claims, 6 Drawing Sheets

SYSTEM AND METHOD OF FAST AMBIENT SWITCHING FOR RAPID THERMAL PROCESSING

FIELD OF THE INVENTION

The invention relates to a system and method for thermal processing of a workpiece, and more particularly relates to a system and method for regulating a processing temperature of the workpiece, and reducing an amount of process gas required to process the workpiece as well as the corresponding gas switching and purge time.

BACKGROUND OF THE INVENTION

Devices for thermal processing have been widely known and utilized to perform a variety of thermal processing methods, including annealing, diffusion, oxidation, and chemical vapor deposition. A common workpiece fabricated utilizing such thermal processing devices is a semiconductor wafer. One of ordinary skill in the art understands these thermal processing devices, especially with regard to the impact of process variables on the quality and uniformity of resulting products.

Single wafer rapid thermal processing (RTP) is a known method for physically and chemically treating semiconductor wafers at high temperatures to achieve desired electronic properties for semiconductor devices. The RTP process typically uses two techniques for heating the wafers. In a first technique, a steady-state hot-wall furnace heats a wafer and the wafer temperature is controlled by the mechanical transport of the wafer along a temperature, or thermal radiation, gradient. In a second technique, a wafer is heated by incandescent, or arc, lamps around a cold wall chamber, and the wafer temperature is controlled by varying the optical output of each lamp.

In a second technique, lamp-based RTP systems can heat and cool a wafer at relatively fast ramp-up and ramp-down rates due to the relatively low thermal mass associated with lamps, which offers a low thermal budget (namely the integration of temperature over time) for wafer processing. The temperature control of a wafer inside a lamp-based RTP depends on the fast switching (on and off) of multiple lamps in response to the temperature readings at one or several locations on the wafer. This process necessitates the use of complex optical and electronic feedback and control systems to achieve the required temperature accuracy and uniformity. A wafer being processed is not in thermal equilibrium with its colder surroundings. This, in combination with the random nature of lamp output control, makes the temperature uniformity and reproducibility of a lamp-based RTP difficult. However, since no lateral transport of a wafer inside an RTP chamber is required except for rotation along the wafer normal, a lamp-based system inherently possesses a small chamber volume (about or below 10 liters) relative to a hot-wall-based RTP furnace (about 100 liters). Thus, fast gas switching can be realized by a lamp-based RTP system during a rapid thermal processing cycle, such that a wafer can be consecutively exposed to different ambient gases in synchronization with the wafer temperature. However, known hot-wall RTP systems do not have the advantage of fast gas switching.

A commercially available hot-wall RTP furnace is described in the U.S. Pat. No. 4,857,689 awarded to High Temperature Engineering Corporation, and has been improved by the addition of an in situ emissivity calibration and closed-loop temperature control system as described in U.S. Pat. No. 6,183,127 awarded to Eaton Corporation (SEO).

To further describe hot-wall RTP systems, an upper section of the hot-wall RTP furnace is constantly heated, while a lower section is actively cooled to maintain a steady-state temperature profile. An ambient gas is continuously introduced into the upper section of the furnace and exhausts from the lower section of the furnace. Consequently, a monotonic temperature and thermal radiation gradient exists along the axis of the RTP furnace. The temperature profile is also axially symmetric, with a radial component optimized to ensure the uniform heating of a wafer. Varying the position of the wafer along the temperature gradient controls the heating of the wafer. Since a thermal steady-state is maintained throughout the entire furnace, and between the furnace and the gas ambient, wafer heating is dominated by the thermal equilibration between the wafer and its furnace environment. Consequently, a hot-wall RTP furnace can yield superior results over the lamp-based RTP systems in terms of temperature uniformity, process reproducibility, and cost, while still possessing comparable performance with regard to thermal budget and process throughput. The hot-wall RTP furnace systems have successfully been used in production for implant anneal and activation, silicidation, dry- and wet-silicon oxide growth, diffusion, and metal anneal.

In comparison with the lamp-based RTP systems, however, the hot-wall RTP systems maintain larger furnace internal volumes. This is because a wafer must travel a span of up to 100 cm to make use of the furnace temperature gradient for temperature variation and control. Hence, the furnace must be sufficiently large to accommodate the large sweep volume of the wafer. For example, the sweep volumes for the 200 mm and 300 mm wafers are approximately 31 and 71 liters, respectively, for a 100 cm sweep, leading to a typical furnace volume of about 100 liters. If the fast switching of ambient gases is required for the processes involving the consecutive applications of multiple ambient gases in a RTP cycle, such fast switching can be difficult. In addition, a large chamber volume tends to increase process gas consumption, wafer contamination levels due to the out-diffusing impurities from hot furnace materials, and safety risks because of the quantities of toxic, corrosive, flammable or explosive process gases at high temperatures.

Since the inception of the RTP processing, some development has focused on techniques to increase the temperature ramp-up and ramp-down rates of a wafer to minimize the thermal budget. Additional development has focused on the accurate temperature measurement and control of wafers. The thermal budget of a rapid thermal annealing (RTA) step directly determines the source/drain junction depth and sheet resistance of CMOS devices through defect annealing, re-crystallization, dopant activation, and diffusion in the implanted layers. In addition to the thermal budget control, fast gas switching capabilities are becoming increasingly important in the RTP processes as the vigorous device scaling necessitates the replacement of a silicon oxide ($SiO_2$) dielectric layer with a layered gate dielectric stacks containing silicon oxide, silicon oxynitride ($SiO_xN_y$), and silicon nitride ($Si_3N_4$), and with high-K dielectric materials in the future. In a two-step RTO process for $SiO_2$ growth (see J. Nulman, J. P. Krusius and P. Renteln, Mat. Res. Soc., Symp. Proc., 52, 341(1985)), for example, a wafer is heated in an oxygen ambient to a preset temperature, and further to a higher temperature, for silicon oxide growth. An RTA is then performed after switching the ambient from oxygen to nitrogen. The RTA step improves the electrical properties of the Si—$SiO_2$ interface.

As another example, the formation of an ultra-thin nitride gate stack by in situ RTP multiprocessing (see S. C. Song, B. Y. Kim, H. F. Luan and D. L. Kwong, M. Gardner, J. Fulford, D. Wristers, J. Gelpey and S. Marcus, Advances in rapid thermal processing, ECS Proceedings of the symposium, V99–100, p45(1999)) requires four consecutive steps in different ambient gases and at different temperatures, namely (1) interface passivation in nitric oxide (NO) gas, (2) silicon nitride ($Si_3N_4$) rapid thermal chemical vapor deposition (RTCVD) using silane ($SiH_4$) and ammonia ($NH_3$) at a low pressure, (3) nitridation in ammonia, and (4) anneal in nitrous oxide ($N_2O$). Therefore, the prolonged purge time between two consecutive RTP steps, which is necessary for an RTP chamber with a large internal volume, will reduce the RTP process throughput.

Vertical-type thermal processing furnaces typically support a processing tube within the furnace in a vertical position. The thermal processing furnace also typically employs a workpiece boat assembly, which mounts to appropriate translation mechanisms for moving the workpiece boat into and out of the processing tube or heating chamber. A separate workpiece handling assembly transfers the workpiece from a storage medium to the workpiece boat assembly. One or more workpieces can be accommodated by the workpiece boat assembly. The workpiece boat assembly then selectively raises and positions the workpiece(s) within the heating chamber to at least partially regulate the temperature to which the workpiece(s) is exposed.

SUMMARY OF THE INVENTION

There exists in the art a need for a thermal processing apparatus for use with multiple and/or hazardous process gases in a sequential manner to process a workpiece while improving processing throughput. The present invention and example embodiments thereof provide solutions to address this need. Solutions include reducing the effective gas ambient volume surrounding a wafer during processing to shorten the gas purge time for fast gas switching, while still maintaining the RTP process performance of existing RTP systems.

A thermal processing apparatus for processing a workpiece includes a heating chamber in accordance with one aspect of the present invention. A small-volume workpiece enclosure is disposed about the workpiece. A translation mechanism, in the form of a positioning assembly, supports the small-volume workpiece enclosure for moving the small-volume workpiece enclosure and the workpiece within the heating chamber. The heating chamber can have a thermal radiation intensity gradient or a temperature gradient for thermally processing the workpiece. The heating chamber can have one or more heating elements disposed about the heating chamber. The heating chamber can be in the form of a bell jar.

In accordance with another aspect of the present invention, a gas supply can be coupled to the small-volume workpiece enclosure for introducing one or more gases into an interior of the small-volume workpiece enclosure.

In accordance with further aspects of the present invention, a gas diffuser can be disposed within the small-volume workpiece enclosure to at least partially regulate the temperature of the workpiece. A surface of the gas diffuser can have a reflective surface that reflects thermal radiation unabsorbed and emmitted by the workpiece back to the workpiece to at least partially regulate the temperature of the workpiece. The reflective surface can also compensate for the thermal radiation loss due to absorption and reflection by workpiece enclosure materials. The reflective surface can be of uniform, or non-uniform, reflectivity. The term "gas diffuser" as utilized herein is intended to describe a component of the thermal processing apparatus that can serve as a diffuser of gases flowing in or around the diffuser, and/or serve as a reflector suitable for reflecting gas and thermal radiation or emissions, depending on the particular arrangement of the gas diffuser within the thermal processing apparatus. The gas diffuser can further include a window formed within the gas diffuser.

A remote sensor, such as a pyrometer, according to a further aspect of the present invention, disposed relative to the small-volume workpiece, can determine the temperature of the workpiece utilizing the window formed within the gas buffer or diffuser. Alternatively, a contact temperature sensor, such as a thermocouple, disposed relative to the small-volume workpiece, can determine the temperature of the workpiece.

According to still another aspect of the present invention, at least one support structure couples to a first section of the small-volume workpiece enclosure, such that when the small-volume workpiece enclosure is lowered to a base portion of the thermal processing apparatus, at least one support structure supports the first section of the small-volume workpiece enclosure. A second section of the small-volume workpiece enclosure is optimally separable from the first section, providing access to an interior portion of the small-volume workpiece enclosure. Alternatively, in a horizontal-type furnace arrangement, a structure couples to a first section of the small-volume workpiece enclosure to aid in separating a first section from a second section, providing access to an inner portion of the small-volume workpiece enclosure.

According to still further aspects of the present invention, the small-volume workpiece enclosure has provided therein at least one aperture formed in a wall, such that gas supplied to the small-volume workpiece enclosure can ultimately escape through the aperture. The heating chamber of the thermal processing apparatus can further include a vent disposed for exhausting gas from the heating chamber.

According to still another aspect of the present invention, an interior wall separates the small-volume workpiece enclosure into a first or outer sub-compartment and a second or inner sub-compartment. The interior wall, according to one aspect, has at least one aperture.

According to still further aspects of the present invention, a gas exhaust is provided in communication with the small-volume workpiece enclosure for exhausting gas in the small-volume workpiece enclosure to a location external to the thermal processing apparatus.

According to one practice, the ratio of the volume of the heating chamber to the volume of the small-volume workpiece enclosure is greater than approximately 2.

The present invention further provides a method of thermally processing a workpiece. The method includes the steps of placing a workpiece to be heated into a small-volume workpiece enclosure, which can be disposed inside a heating chamber. The heating chamber and the small-volume workpiece enclosure are heated, and the small-volume workpiece enclosure is positioned within the heating chamber of the thermal processing apparatus. The workpiece is thermally processed when resident within the heating chamber.

The method according to further aspects of the present invention can include the step of positioning the small-volume workpiece enclosure at one or more positions in the thermal processing apparatus as required to control heating of the workpiece.

According to another aspect of the present invention, the small-volume workpiece enclosure is supplied with a gas (including a sequence of gases) to interact with the workpiece and at least partially regulate heating of the workpiece. The gas can be preheated prior to being supplied to the small-volume workpiece enclosure. Upon entering the small-volume workpiece enclosure, the gas can be partially regulated with a gas diffuser.

According to yet another aspect of the present invention, the method of thermally processing a workpiece housed within the small-volume workpiece includes the step of exhausting gas from the small-volume workpiece enclosure into the thermal processing apparatus. The method can further include the step of venting the thermal processing apparatus to exhaust any gases released from the small-volume workpiece enclosure, or any other process gases. Alternatively, the method can include the step of exhausting the gas through an exhaust line from the small-volume workpiece enclosure. The exhaust line can lead directly out of the thermal processing apparatus.

According to another aspect of the present invention, the method of thermally processing the small-volume workpiece can include the step of exhausting gas to the heating chamber from the small volume workpiece enclosure to dilute, scavenge, or purge the gas from the small-volume workpiece enclosure.

According to another aspect of the present invention, the method of thermally processing the small-volume workpiece can include the steps of using plasma and photon energizing devices to energize process gases prior to entering the small volume workpiece enclosure.

In accordance with still another aspect of the present invention, a thermal processing apparatus for processing a workpiece is provided. The thermal processing apparatus includes a heating chamber having at least one of a thermal radiation intensity gradient and a temperature gradient. A small-volume workpiece enclosure is disposed about the workpiece, and a positioning assembly that supports the small-volume workpiece enclosure and moves the small-volume workpiece enclosure and the workpiece to desired locations is disposed within the heating chamber to subject the workpiece to different heating levels. The thermal processing apparatus is capable of performing a dry or wet rapid thermal oxidation technique, rapid thermal nitridation technique, rapid thermal anneal technique for implant diffusion and activation of metal silicides, rapid thermal BPSG reflow technique, selective oxidation technique of Si in the presence of a metal, rapid thermal chemical vapor deposition technique, low pressure chemical vapor deposition technique, metal-organic chemical vapor deposition technique, remote-plasma chemical vapor deposition technique, and multi-layer dielectric gate stack formation technique.

BRIEF DESCRIPTION OF THE DRAWINGS

The aforementioned features and advantages, and other features and aspects of the present invention, will be better understood with regard to the following description and accompanying drawings, wherein.

DETAILED DESCRIPTION OF THE INVENTION

The present invention generally relates to a system and method for thermally processing a workpiece. More specifically, the system and method relate to a thermal processing system having the capability for fast switching of ambient gases around a workpiece. In accordance with one embodiment of the present invention, a quartz small-volume workpiece enclosure mounts on a quartz elevator tube. Process and other gases flow up through an internal portion of the elevator tube, underneath the workpiece, across the top of the workpiece, and out of the small-volume workpiece enclosure through one or more holes in a top or lid portion of the enclosure. The amount of gas required is relatively small due to the relatively small volume of the small-volume workpiece enclosure. The process gas, which can be hazardous, exhausts from the small-volume workpiece enclosure into a larger heating chamber where a flow of scavenger gas(es) (such as inert or non-reactive gases) dilute the process gas a sufficient amount prior to venting the gas out of the thermal processing apparatus. The separate scavenger gas flows through the heating chamber, sweeping the exhausted gases out of the heating chamber.

The term "small-volume" as utilized herein includes an enclosure sized and dimensioned such that a ratio of the volume of the larger heating chamber to the volume of the small-volume workpiece enclosure is greater than approximately two. For example, a heating chamber having a volume of 10 liters, can have a small-volume workpiece enclosure of, e.g., 0.5 liters, 2 liters, up to approximately 5 liters; a heating chamber having a volume of 90 liters, can have a small-volume workpiece enclosure up to approximately 45 liters. The volume for the small-volume workpiece enclosure depends upon such factors as the size of the workpiece, the size of any apertures or fixtures in the enclosures, the volume required to support a desired flow of gases, and the like.

According to other embodiments of the present invention, the potentially hazardous gases within the small-volume workpiece enclosure do not exhaust into the larger heating chamber, but instead exhaust from the small-volume workpiece enclosure directly through a dedicated exhaust connection and out of the thermal processing system. An enclosure positioning assembly, which serves to position the small-volume workpiece enclosure within the heating chamber, includes two tubes or lines, one serving as a gas supply line and the other serving a gas exhaust line. The injected process or other gases flow through a tube in the elevator and into an outer sub-compartment of the small-volume workpiece enclosure. The gas continues through at least one, and preferably a series, of apertures from the outer sub-compartment to an inner sub-compartment of the small-volume workpiece enclosure, where the gas flows across the workpiece. The gas then leaves the inner sub-compartment through one or more exhaust vents, travels through the enclosure positioning assembly, and exits the thermal processing apparatus.

The embodiments illustrated herein depict the thermal processing apparatus configured for the thermal processing of a single semiconductor wafer at one time. However, it is intended that the invention not be limited solely to the thermal processing of single semiconductor wafers, but that the embodiments illustrated herein and the corresponding spirit and scope of the invention shall encompass the thermal processing of single or multiple workpieces requiring specific, predetermined, and substantially controllable thermal conditions for processing.

FIGS. 1–6, wherein like parts are designated by like reference numerals throughout, illustrate example embodiments of a thermal processing apparatus according to the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed, such as the size, shape, or type of elements or materials in a manner still in keeping with the spirit and scope of the present invention.

Figure 1:
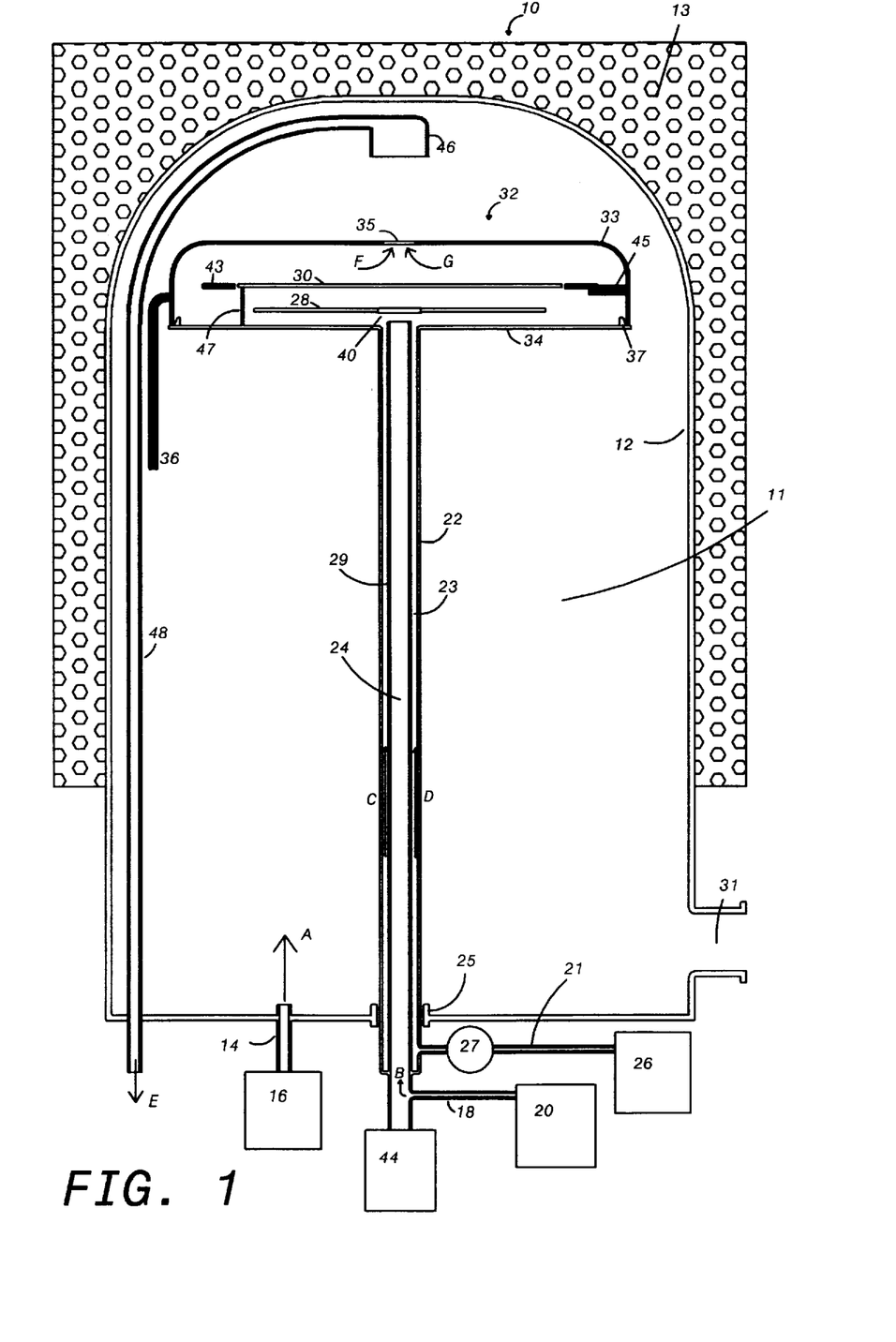
FIG. 1 is a diagrammatic illustration of a thermal processing apparatus employing a small-volume workpiece enclosure according to the teachings of the present invention.

FIG. 1 illustrates one example embodiment of a thermal processing apparatus 10 in accordance with the teachings of the present invention. A heating envelope 13 forms the exterior structure of the thermal processing apparatus 10, in which a heating (or process) chamber 11 formed by a chamber wall 12 is housed. The heating envelope 13 can contain a plurality of different types of heating elements such as incandescent lamps, arc lamps, heating coils, and the like. The heating envelope 13 can also maintain several zones having different temperatures and actively-cooled sections.

The chamber wall 12 can be made of thermal radiation transparent materials (e.g. quartz) for lamp-based heating configurations or thermal radiation non-transparent materials (e.g. silicon carbide) for hot wall-based heating configurations. The chamber wall 12 can have different shapes besides a bell jar, such as cylindrical, cubic, spherical, and the like. The chamber wall 12 may define the heating chamber 11 with various orientations as defined by a workpiece traveling direction, including the vertical and horizontal directions.

Heating elements can be placed directly inside the heating chamber 11. Additional structures, such as heating elements and isolation structures etc, are omitted for the sake of simplicity and clarity in describing the invention. The basic function of the heating chamber 11 and the heating envelope 13 of the thermal processing apparatus 10 is to provide a confined environment with a temperature or thermal radiation gradient in at least one direction. The operation pressure in the heating chamber 11 can range from zero up to several atmospheric pressures by means of vacuum technology and pneumatics (e.g. vacuum pumps, flow rate controllers, pressure controllers, and the like). Example thermal processing apparatuses include the rapid thermal processing furnaces described in U.S. Pat. No. 4,857,689 and U.S. Pat. No. 6,183,127, the contents of which are incorporated herein by reference.

A gas inlet 14 introduces a scavenger gas flow from a gas source 16 into the heating chamber 11. The term "scavenger gas" is utilized herein in accordance with the general understanding of the term by one of ordinary skill in the art. Scavenger gas can include any inert gases (e.g., He, Ar), non-reactive gases (e.g., $N_2$) and other gases (e.g., $O_2$). The gas inlet 14 can be designed to spread the scavenger gas uniformly across the base of the heating chamber 11 via perforated plates, rings, and the like, or annularly via circular slits. This scavenger flow A ascends inside the heating chamber 11, while remaining clear of a workpiece enclosure 32 and a positioning assembly 22, to merge with and dilute a process gas flow F and G exiting from an exit aperture 35 of the workpiece enclosure 32. The term "process gas" as utilized herein generally refers to one or more gases in physical contact with a workpiece in the thermal processing apparatus 10. Process gases include plasmas, gases containing electrons, ions, atoms, radicals, energetically-excited species, and the like.

An exhaust hood 46 serves to evacuate or exhaust gas from within the heating chamber 11 through a gas exhaust line 48 and out of the thermal processing apparatus 10 in the direction of arrow E. The gas exhaust line 48 can be connected to a number of different types of vacuum valves and vacuum pumps (not shown) to operate the heating chamber 11 at pressures ranging from zero up to a few atmospheric pressures. To control the pressure, the flow rates of the scavenger gases, process gases, and purge gases are regulated simultaneously while controlling the gas evacuation rate from the heating chamber 11. The term "purge gas" as utilized herein indicates a gas that does not interfere with a remote temperature sensor or the processing of a workpiece, and is used to replace other gases in an optical pathway of a remote temperature sensor.

The scavenger gas flow rate can be much larger than a process gas flow rate to purge the entire heating chamber 11 effectively. The flow direction of the scavenger gas can be reversed by supplying scavenger gas from the gas source 16 to the gas exhaust line 48, and exhausting the gas through the gas inlet 14. The scavenger gas flow rate can be set to zero for applications that require low pressures, or a vacuum.

Figure 2:
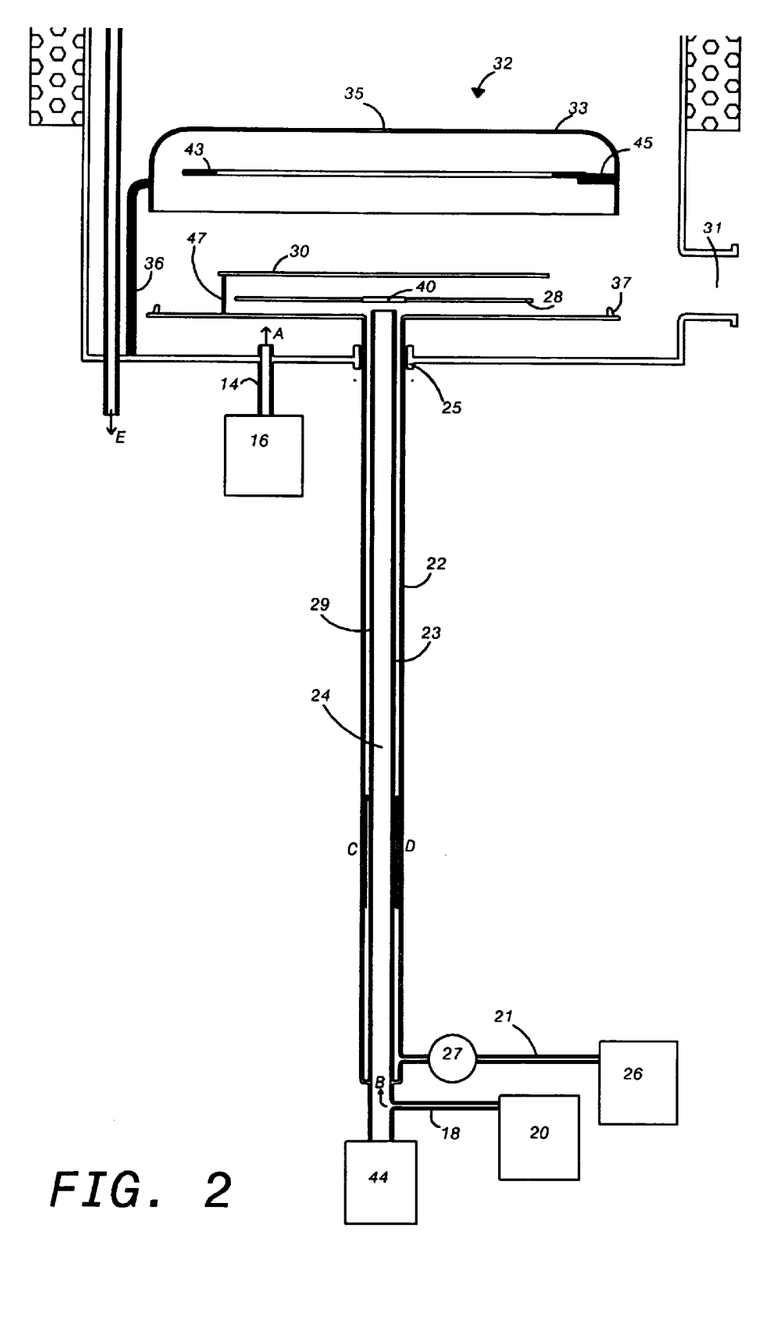
FIG. 2 is a diagrammatic illustration of the thermal processing apparatus of FIG. 1 in an idle position according to one aspect of the present invention.

The enclosure positioning assembly 22 mounts through the bottom of the heating chamber 11 and can extend upwardly and retract downwardly within the heating chamber 11. The enclosure positioning assembly 22 can couple to the heating chamber 11 via a gas bearing 25 or other known technique such as elastic seal, bellows, differential pumping, and the like, to ensure the gas integrity of the heating chamber 11. The enclosure positioning assembly 22 can be in the form of an elevator assembly for a vertical-type thermal processing apparatus as illustrated in FIGS. 1 and 2. The positioning assembly 22 can also be used in a horizontal-type or other type of thermal processing apparatus.

The positioning assembly 22 of the illustrated embodiment in FIGS. 1 and 2 includes two co-axial tubes. An interior cavity 24 of an inner tube 29 provides an optical path or a path for electrical wires for use with a temperature sensor 44 located at the lower end of the inner tube 29. The interior cavity 24 of the inner tube 29 can be purged with an optically inactive gas flow B from a purge gas source 20 through a purge gas inlet 18. The purge gas significantly diminishes the interference to pyrometric temperature measurement caused by the optical absorption of certain process gases. The optical path, as utilized herein in reference to temperature measurement, refers to a physical passageway for thermal radiation emitted and reflected by a workpiece toward a remote temperature sensor as understood by one of ordinary skill in the art. More specifically, the optical path allows thermal radiation emitted by the workpiece to pass through the positioning assembly 22 for detection by a remote temperature sensor. The purge gas flow rate can be set much lower than the process gas flow rate to minimize any purge gas effect on the processing of the workpiece 30.

A gap 23 between the inner tube 29 and an outer wall of the enclosure positioning assembly 22 forms a gas passageway for process gases from a gas supply 26. The process gas can flow along the gap 23 of the positioning assembly 22 into the small volume workpiece enclosure 32. The gas supply 26 can supply one or more kinds of gases simultaneously and/or sequentially. Multiple gas passageways can be incorporated into the enclosure positioning assembly 22 for different process gases as well.

A remote plasma can be used as the processing ambient inside the small volume workpiece enclosure 32 by employing an energizing device 27 coupled to a process gas inlet 21 extending from the gas supply 26. The energizing device 27 can be a plasma generating device, such as a micro-wave (MW) cavity, a radio-frequency (RF) antenna or electrode, DC discharge electrode or the like.

A gaseous medium containing electrons, ions, atoms, radicals, and/or excited species can also be used as the processing ambient inside the small volume workpiece enclosure 32 by employing different types of energizing devices 27. In another embodiment, the energizing device 27 can be a photo-energizing cell to ionize and dissociate process gases prior to entering the workpiece enclosure 32. Photon sources for the energizing device 27 can be laser beams, synchrotron radiation, lamps (VUV, UV-visible and IR light), or the like.

The small-volume workpiece enclosure 32 mounts at a top end of the enclosure positioning assembly 22. The small-volume workpiece enclosure 32 has a lid 33 separated from a base 34. The lid 33 rests on the base 34 when the small-volume workpiece enclosure 32 resides at an elevated position within the heating chamber 11 as shown in FIG. 1.

An intersection between the lid 33 and the base 34 should be gas-tight. In practice, it suffices to provide a sufficient flow resistance to limit the percentage of gas escape or exchange between the contacting surfaces of the lid 33 and base 34 sections. The alignment of the lid 33 with respect to the base 34 is aided by employing a self-aligning feature 37 on the base 33. Other structures having the same function can be utilized as understood by one of ordinary skill in the art. The small-volume workpiece enclosure 32 is largely transparent to thermal radiation in the illustrated embodiment, and can be made of one or more types of high temperature materials, such as quartz, sapphire, ceramics, and the like. The small-volume workpiece enclosure 32 can likewise be reflective, semi-transparent, or opaque to thermal radiation, depending on the particular thermal process being implemented, and the type of workpiece being formed.

A supporting device 36, such as tripod legs, extends from the lid 33 below the bottom of the base 34 for loading and unloading the workpiece 30. When the enclosure positioning assembly 22 lowers sufficiently toward the base of the heating chamber 11 to an idle position, the supporting device 36 rests on the base of the heating chamber 11 and supports the lid 33. The lid 33 and the base 34 separate from each other when the enclosure positioning assembly 22 lowers an additional amount (see FIG. 2). Consequently, the interior portion of the small-volume workpiece enclosure 32 becomes accessible to a workpiece transfer device (not shown) through a gate 31 in the lower section of the heating chamber 11.

The supporting device 36 can take other forms in addition to tripod legs, such as features that can be supported by rods extending out of the vertical wall near the chamber bottom, or one or more rods extending vertically from the base of the chamber wall 12. The lower section 34 of the small-volume workpiece enclosure 32 can be integrally formed with the enclosure positioning assembly 22, or can be a separate component that is operatively coupled thereto.

The internal portion of the small-volume workpiece enclosure 32 can include a gas diffuser 28. The gas diffuser 28 can have a window 40 formed therein. The diffuser 28 is disposed above the base 34 and below the workpiece 30. The workpiece 30 resides on supporting features 47 extending from the base 34 of the workpiece enclosure 32. The supporting features 47 can be pins, sharp edges, flat surfaces, and the like. The workpiece 30 can be placed into and taken out of the small-volume workpiece enclosure 32 when the lid 33 is self-supported, and there is a gap between the lid 33 and the base 34 (see FIG. 2).

The gas diffuser 28 manipulates the gas flow pattern inside the small-volume workpiece enclosure 32, for example, by diverting and spreading the incoming gas flow from the center to the edge of the small-volume workpiece enclosure 32. The incoming gas flow is normally colder than the workpiece 30 and the gas diffuser 28. The gas diffuser 28 can pre-heat the incoming gas or gases before interacting with the workpiece 30. Gas preheating can be fine-tuned by controlling the thermal radiation absorbing power of the gas diffuser 28. A higher thermal radiation absorbing power of the gas diffuser 28 leads to a higher average temperature of the diffuser, which preheats the incoming gas flow more effectively. The use of the gas diffuser 28 substantially hinders the local cooling of the workpiece 30 by the colder incoming gas flow. Alternatively, the incoming gas flow can spread to the edge of the workpiece enclosure 32 before entering the workpiece enclosure 32. The gas diffuser 28 can take the form of ring structures and the like. The thermal processing apparatus 10 may also not require the use of the gas diffuser 28, depending on the particular application or workpiece 30.

To expand upon the gas diffuser 28 acting as a reflector, the gas diffuser 28 can serve as a thermal radiation reflector or compensator. The gas diffuser 28 can reflect thermal radiation emitted and unabsorbed by the workpiece 30 back toward the workpiece 30 to compensate the thermal radiation intensity loss due to the absorption and reflection by the lid 33 and base 34 sections. The thermal radiation reflection, as well as thermal radiation emission of the gas diffuser 28, can increase the temperature of the workpiece 30. The gas diffuser 28 can also reflect thermal radiation away from all or part of the workpiece 30 to achieve temperature control and temperature uniformity of the workpiece 30.

The gas diffuser 38 can be made of one or more types of high temperature materials, such as quartz with controlled finish, quartz fiber, ceramics, silicon carbide, sapphire, and the like. The gas diffuser 28 can have a number of various sizes and shapes, and arranges at a pre-determined distance from the workpiece 30 for further manipulation of gas flow patterns within the small-volume workpiece enclosure 32.

The gas diffuser 28 includes a surface having one of a uniform reflectivity or a varying reflectivity, as a function of the location on the gas diffuser 28, to fine tune the temperature uniformity of the workpiece 30. Certain applications of rapid thermal processing, for example, require wafer-to-wafer temperature repeatability on the order of ±1° C. (in 1 σ), and relatively little perceptive difference in temperature between different portions of each wafer, e.g., on the order of ±1° C. (in 1 σ). The different or varying reflectivity levels of the gas diffuser 28 determine the amounts of the reflected thermal radiation toward different portions of the workpiece 30, and thus, can be employed to fine tune the uniform heating of the workpiece 30.

The gas diffuser 28 can physically be split into two entities. The first entity can serve as a gas diffuser to manipulate the gas flow pattern within the workpiece enclosure 32, while the second serves as a thermal radiation reflector to regulate the thermal radiation received by the workpiece 30. For example, a thermal radiation reflector can be in the form of a reflective surface on the bottom surface of the base 34, while the diffuser is made of a highly transparent material to thermal radiation. More than one gas diffuser and thermal radiation reflector can be placed about the workpiece enclosure 32. A ring 43 can also be placed around the edge of the workpiece 30 to selectively shield the edge of the workpiece 30 from thermal radiation and prevent overheating along the edge. The ring 43 mounts on supporting fingers 45 protruding from the inner wall of the lid 33. Alternatively, the optical transmittance in certain portions of the lid 33 can be rendered to selectively reduce the amount of thermal radiation received by the edge of the workpiece 30.

The temperature sensor 44 is disposed at a lower end of the enclosure positioning assembly 22 and externally to the heating chamber 11. The temperature sensor 44 measures the temperature of the workpiece 30 during thermal processing. The temperature sensor 44 can be of non-contact type, e.g. a pyrometer. The pyrometer requires an optical path, as provided by the window 40 of the gas diffuser 28 and the interior cavity 24 of the inner tube 29. The setup and operation of a pyrometer is well-established and will not be further discussed herein. The aforementioned U.S. Pat. No. 6,183,127 describes a system suitable for determining wafer temperature and emissivity.

Some process gases detrimentally absorb thermal radiation relied upon by the non-contact type temperature sensor. This can be addressed by purging the optical pathway of the remote temperature sensor with an optically non-absorptive gas in the direction of arrow B. The purge gas (e.g. Ar, or He, $N_2$) can be introduced from the purge gas source 20 through the purge gas inlet 18 and the interior cavity 24 of the inner tube 29. The process gas and the purge gas merge below the gas diffuser 28. Purge gases for the optical passageway can be any gases that do not interfere with the remote temperature sensor and do not cause chemical or physical changes to the workpiece 30.

The temperature sensor 44 can also be of contact type, namely a temperature reading device with a remote sensor (e.g., a voltage-measuring device with a thermocouple) or the like. The remote sensor requires a physical path for electric wires (not shown) to extend from the workpiece enclosure 30, through the enclosure positioning assembly 22, to the temperature reading device. The thermocouple can make contact with the workpiece 30, or maintain a predetermined distance from the workpiece 30, to measure the temperature of the workpiece 30. The structural and operational details of the thermocouple are known to one of ordinary skill in the art, and will therefore not be further discussed herein.

In accordance with the teachings of the present invention, a process gas or a sequence of different process gases from the process gas supply 26, can be introduced at the process gas inlet 21. The process gas flow can be energized by the plasma energizing device 27 to yield a plasma using electromagnetic fields, radical-containing gases using photons, or a gas medium containing electrons, ions and radicals using various light sources. The process gas (or plasma) flow ascends inside the gap 23 of the positioning assembly 22 to the gas diffuser 28 where it mixes with the purge gas flow and spreads outwards between the gas diffuser 28 and the enclosure base 34. The process gas flows upward and around the gas diffuser 28, and over the workpiece 30 for gas-surface interaction, to ultimately exit the small-volume workpiece enclosure 32 through an aperture(s) 35 into the heating chamber 11 (flows F and G). The flow rate of the process gas can be used to partially regulate the overall temperature and temperature uniformity of the workpiece 30 through thermal convection and conduction.

The combination of limiting the process gas volume with the workpiece enclosure 32 and diluting the process gas passing through the aperture(s) 35 with a scavenger gas flow A is useful when processing the workpiece 30 with potentially hazardous gas. For example, hydrogen is required for certain RTP processes. However, the explosive risk is extremely high if the larger (≈100 liters) heating chamber 11 is filled with pure or highly-concentrated hydrogen and maintained at processing temperatures of, e.g., 500° C. to 1,500° C. When the workpiece enclosure 32 is used in accordance with the teachings of the present invention, the quantity of hydrogen present in the thermal processing apparatus 10 is significantly reduced relative to an otherwise similar thermal processing system that does not utilize a small volume workpiece enclosure. More specifically, the quantity of the process gas, e.g., hydrogen, is reduced by a factor equivalent to the internal volume ratio of the heating chamber 11 to the small volume workpiece enclosure 32, while the workpiece 30 is still exposed to the hazardous process gas. The hydrogen-containing process gas flow from the workpiece enclosure 32 is readily diluted by the scavenger gas flow to a level, e.g., below 4%, which is a safe venting level according to current industry standards.

The scavenger gas can be an inert or non-reactive gas, such as He, Ne, Ar, Kr, Xe and $N_2$, or their mixtures. The scavenger gas can also be a reactive gas, such as $O_2$. Depending on the specific thermal process being executed, other reactive or non-reactive gases can also be used.

The process gases can be the same as the scavenger gases. The process gases can additionally include $H_2$, $H_2O$, $O_2$, $O_3$, halogen containing gases or vapors (e.g. $F_2$, HF, $Cl_2$, HCl, $Br_2$, HBr, $I_2$), interhalogen molecules (e.g., ICl, IBr), nitrogen containing gases or vapors (e.g., NO, $N_2O$, $NH_3$), Si, Ge, B, P, As, and Ga containing chemical vapor deposition precursors, metal (e.g. Al, W, Cu, Ti, Co, Ta) containing gases or vapors, metal organic chemical vapor deposition precursors, and gases containing electrons, ions, atoms, or radicals.

The process gases can also contain electrons, ions, atoms, or radicals, which can be produced by various energizing methods using plasma, electron, photon, electrical discharge, radioactive radiation, or the like. The energizing device 27, such as radio frequency (RF) antenna/electrodes, micro-wave (MW) cavities, discharge electrodes, ultra-violet light sources, radioactive materials, laser beams, synchrotron radiation, and lamps (VUV, UV-visible and IR light) can be incorporated into the process via the process gas inlet 21 of the workpiece enclosure 32.

Figure 3:
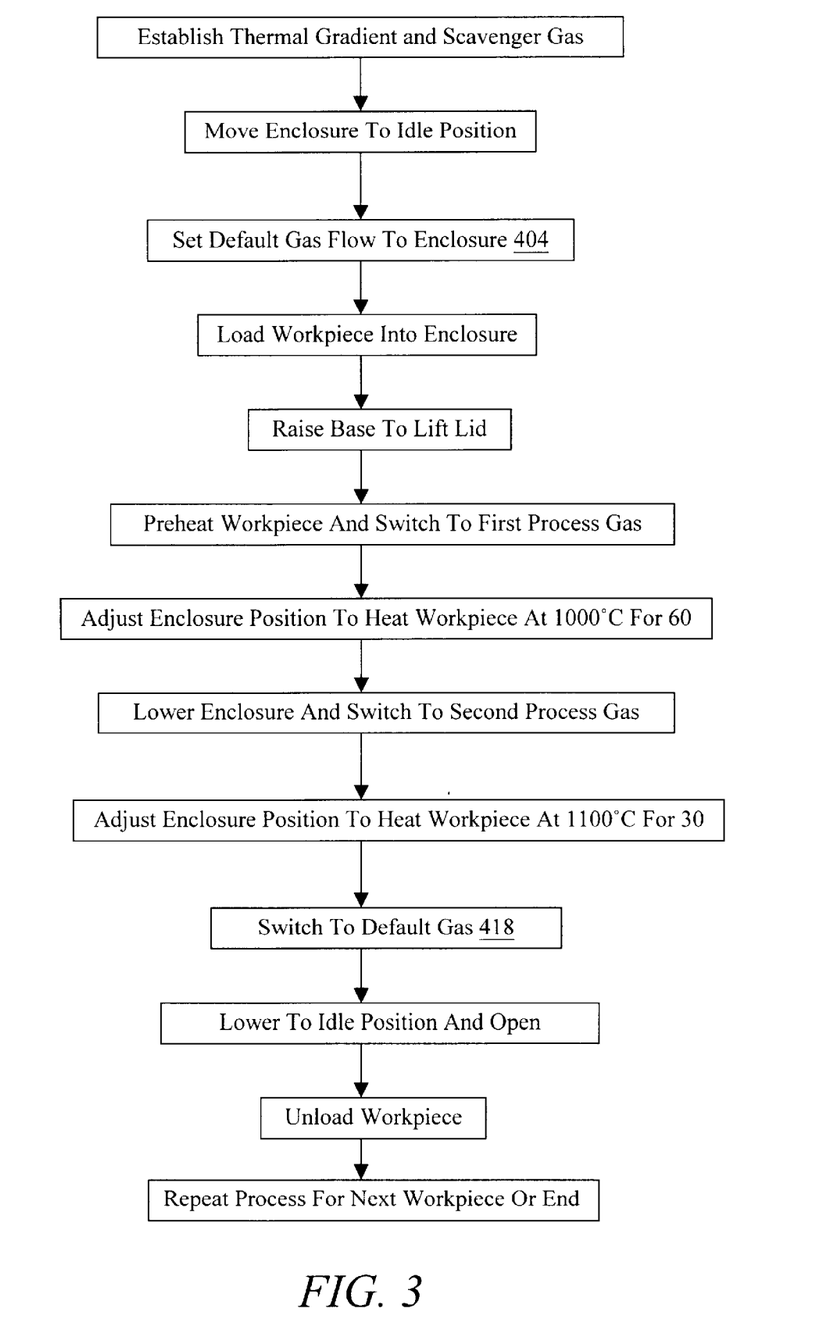
FIG. 3 is a flow chart depicting a loading, processing, and unloading of a workpiece in accordance with aspects of the present invention.

FIG. 3 illustrates a flowchart depicting one example implementation of the embodiment of the present invention shown in FIGS. 1 and 2 in accordance with the teachings of the present invention. The application of the small volume workpiece enclosure 32 in the thermal processing apparatus 10 can be demonstrated in a two-step RTP process for SiO$_2$ growth on a Si(100) wafer as the workpiece 30. The first step is to grow SiO$_2$ thin film in a pure oxygen ambient at 1000° C. for 60 seconds. The second step is to anneal the SiO$_2$ thin film in a pure argon ambient at 1100° C. for 30 seconds. Nitrogen is used as the scavenger gas. Since all gases used do not interfere with the remote temperature sensor 44, no purge gas is needed to purge the interior cavity 24 of the enclosure positioning assembly 22. The operational conditions of each step are chosen for illustrative purposes only and are not intended to depict a method that produces a silicon oxide film with the best electrical properties.

To carry out the aforementioned two-step RTP processing, a suitable thermal radiation and temperature gradient is established inside the heating chamber 11 by the heating element(s) deployed about the heating chamber 11, and a nitrogen scavenger gas flow (e.g. 50 SLM, i.e. standard liter per minute) is initiated from the gas source 16 into the gas inlet 14 (step 400). The heating chamber 11 maintains one atmosphere pressure. A purge gas flow through the inner tube 24 is not required because none of the gases utilized in this example (argon, nitrogen, and oxygen) interferes with the non-contact temperature sensor 44 used, i.e. an infrared pyrometer. Process gas energizing is also not required in this two-step RTP processing example because only oxygen and argon are used as the process gases.

The idle position of the enclosure positioning assembly 22 is also the workpiece 30 load/unload position where the base 34 of the workpiece enclosure 32 rests near the bottom of the heating chamber 11. The positioning assembly 22 lowers the workpiece enclosure 32 to the idle position (step 402). The lid 33 is self-supported on the supporting device 36 so that a gap exists between the lid 33 and the base 34 for a Si(100) wafer to be loaded onto the supporting features 47 of the workpiece enclosure 32 (step 406).

A nitrogen flow (e.g. 10 SLM) from the process gas supply 26 is introduced as a default process gas through the process gas passageway 23 to purge the space between the lid 33 and base 34 of the opened workpiece enclosure (step 404, see also FIG. 2). The default gas can be provided to flow through the thermal processing apparatus 10 during periods before, during, and after thermal processing of the workpiece 30, when no other process gas is required. The workpiece 30 in the form of the Si(100) wafer is loaded onto the pin 47 by a robotic arm through the gate 31 (step 406). The positioning assembly 22 raises the base 34 to meet and lift the lid 33, which closes the small volume workpiece enclosure (step 408). After the lid 33 is lifted by the base 34, the default nitrogen gas flows between the gas diffuser 28 and the base 34, around the edges of the gas diffuser 28 and the Si(100) wafer workpiece 30, and over the top surface of the Si(100) workpiece 30, exiting from the workpiece enclosure 32 via the aperture 35.

In using the small-volume workpiece enclosure 32, the effective volume of the process gas (also denoted as the gas ambient) surrounding the Si(100) workpiece 30 is substantially reduced to the internal volume contained by the lid 33 and the base 34 of the workpiece enclosure 32. Thus, fast switching of the process gases around the workpiece is realized.

In addition, gases (nitrogen, oxygen and argon in this case) exhausting from the aperture 35 of the workpiece enclosure 32 merge and mix with the nitrogen scavenger gas in the heating chamber 11. The mixed gas flow enters the exhaust hood 46 and exits from the entire thermal processing system 10 through the gas exhaust line 48.

The two-step RTO+RTA processing cycle initiates under the automatic control of a host computer (not shown). The processing parameters, such as the positioning assembly 22 height H (in mm), the workpiece 30 (wafer) temperature T (in ° C.), and the nitrogen, oxygen, and argon flow rates (in SLM) into the process gas inlet 21, are controlled, synchronized, and recorded in real-time. When the workpiece 30 is preheated to a preset temperature (e.g. 700° C.), the process gas supply 26 switches from the default nitrogen flow to a first process gas, for example, oxygen, at a suitable flow rate (e.g. 10 SLM) (step 410). The position of the workpiece enclosure 32 within the heating chamber 11 is raised further and adjusted to maintain the workpiece 30 at a desired temperature 1000° C. for 60 seconds (step 412) to oxidize the Si(100) workpiece, namely the rapid thermal oxidation (RTO) step.

The workpiece enclosure 32 is then lowered to cool down the Si(100) wafer. Meanwhile, the process gas supply 26 terminates the oxygen flow and begins to input argon gas at a suitable flow rate (e.g. 10 SLM) as a second process gas (step 414).

The workpiece enclosure 32 is raised again to heat the Si(100) workpiece 30 to 1100° C. The position of the positioning assembly 22 is adjusted to maintain the Si(100) wafer at 1100° C. for 30 seconds for rapid thermal anneal (RTA) in argon ambient (step 416).

The process gas supply terminates the argon gas and begins the default nitrogen gas flow at a suitable flow rate (e.g. 10 SLM) (step 418), while the workpiece enclosure 32 is lowered. The enclosure lid 33 separates from the enclosure base 34 and opens a gap between the lid and the base (step 420). At the idle position of the positioning assembly 22, the Si(100) wafer is unloaded by a robotic arm through the gate 31 (step 422), completing the entire thermal processing cycle involving two consecutive steps. The process can continue for a next workpiece (step 424).

The exhausting of process gases from the workpiece enclosure to the heating chamber may be problematic if incompatible process gases are used consecutively. For example, in a formation of an ultra-thin nitride gate stack, nitric oxide (NO) may not be completely purged out of the heating chamber 11 by the scavenger gas flow before a next silane/ammonia step. Consequently, residual nitric oxide (NO) might react with ammonia (NH$_3$) exiting from the small-volume workpiece enclosure 32 forming water vapor (H$_2$O) and nitrogen (N$_2$) inside the heating chamber 11. The increased humidity can cause the oxidization of a silicon workpiece to its detriment during its loading and unloading. Although this problem can be solved by purging both the entire heating chamber 11 and the workpiece enclosure 32 with a non-reactive gas between the two consecutive steps, the purging will significantly reduce the thermal processing throughput.

Figure 4:
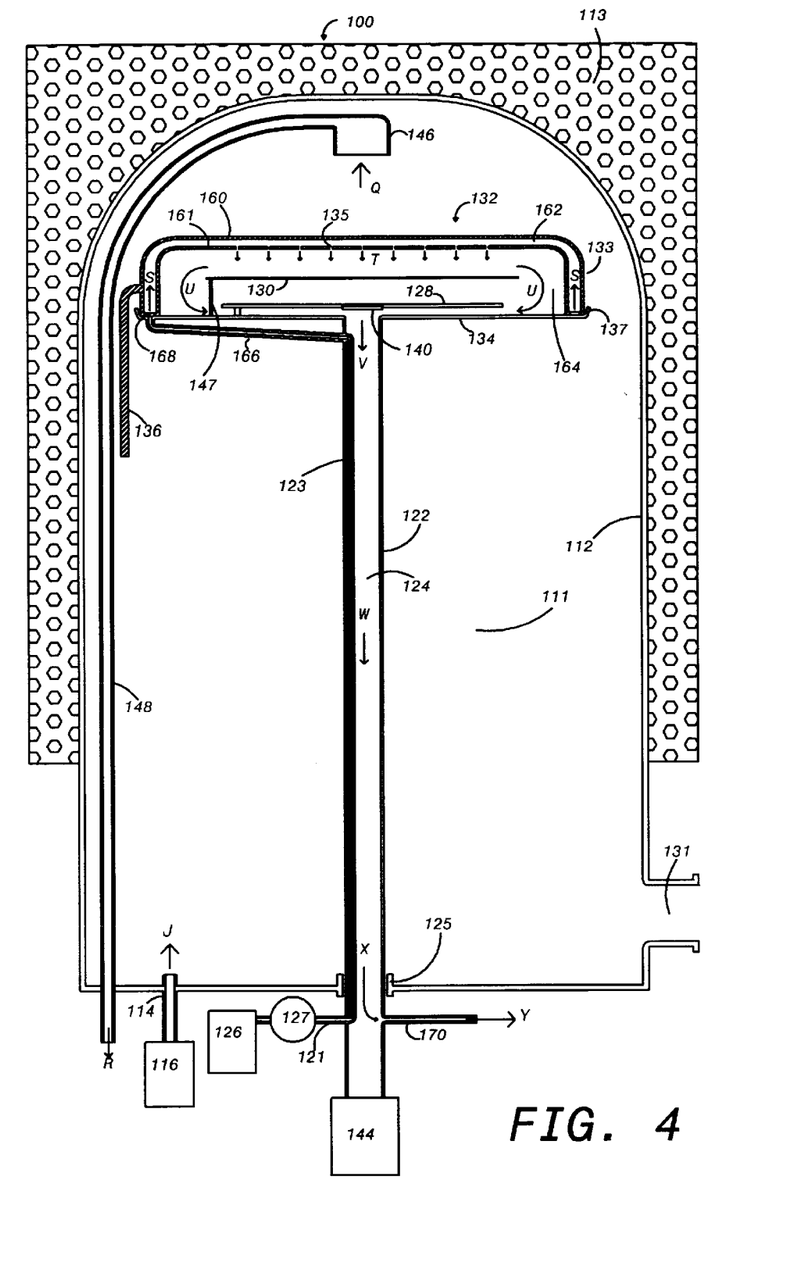
FIG. 4 is a diagrammatic illustration of another thermal processing apparatus embodiment according to the teachings of the present invention.
Figure 5:
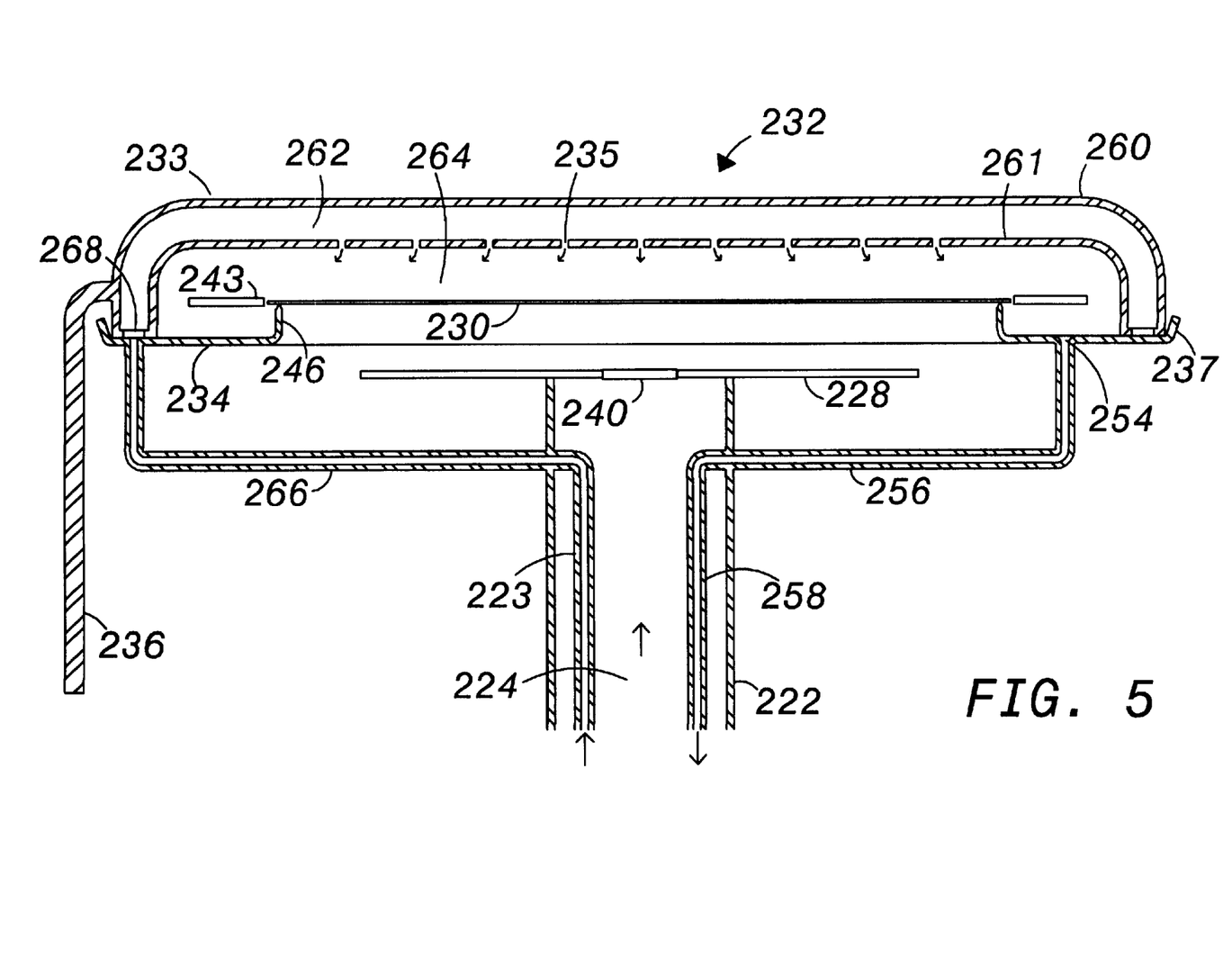
FIG. 5 is a diagrammatic illustration of still another thermal processing apparatus embodiment according to the teachings of the present invention.
Figure 6:
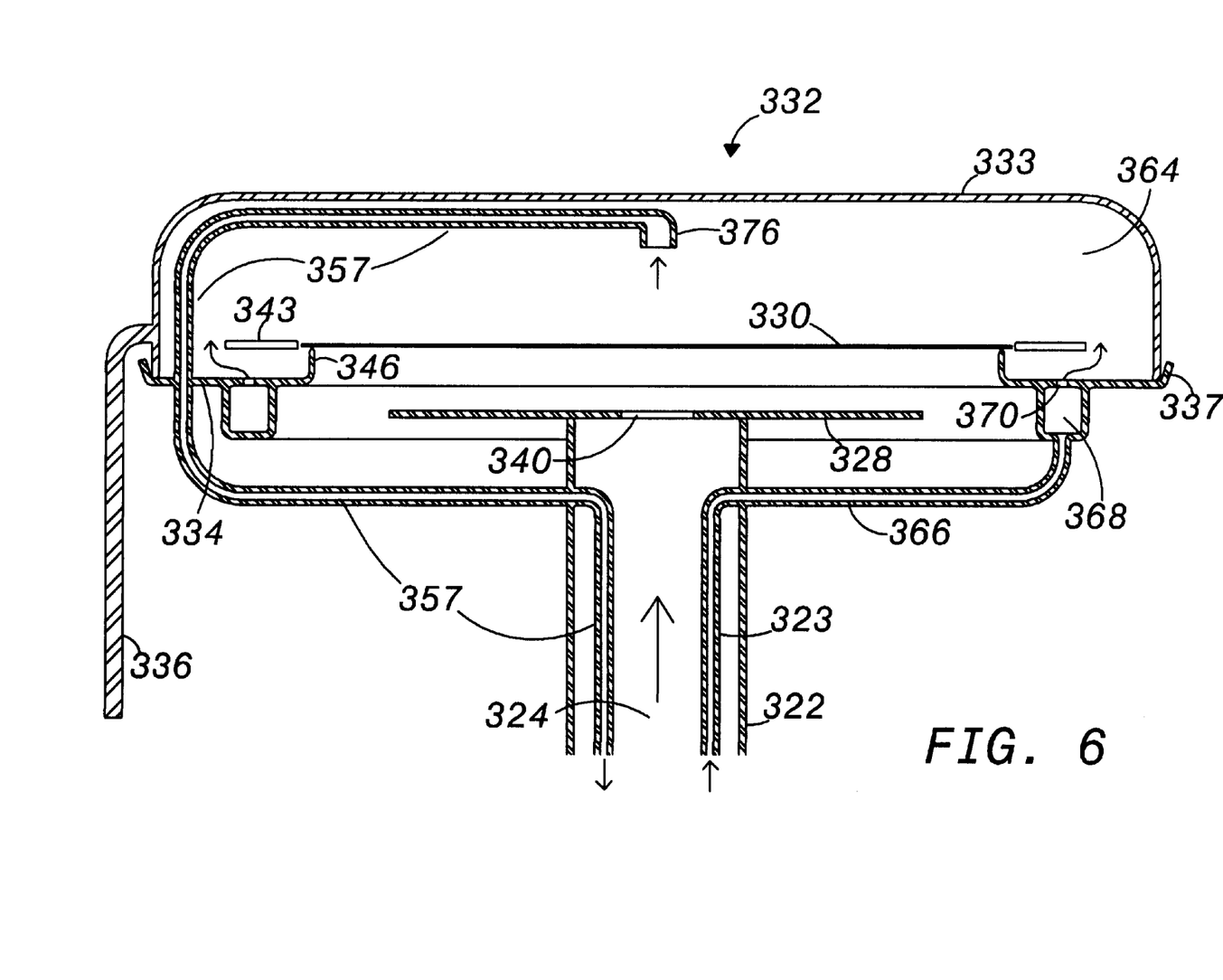
FIG. 6 is a diagrammatic illustration of yet another thermal processing apparatus embodiment according to the teachings of the present invention.

FIGS. 4, 5, and 6 provide alternative embodiments in accordance with the teachings of the present invention. In these embodiments, exhaust gases from the workpiece enclosure flow directly out of the entire thermal processing apparatus.

FIG. 4 illustrates a thermal processing apparatus 100 embodiment in accordance with the teachings of the present invention. A heating envelope 113 forms the exterior structure of the thermal processing apparatus 100, in which a heating chamber 111 formed by a chamber wall 112, is housed. The heating envelope 113 can contain a number of different heating elements, such as incandescent lamps, arc lamps, heating coils, and the like. The heating envelope 113 can also have several zones with different temperatures and actively-cooled sections.

A gas inlet 114 introduces a scavenger gas flow from a gas source 116 into the heating chamber 111. The gas inlet 114 can be designed to spread the scavenger gas uniformly across the base of the heating chamber 111 via perforated plates, rings and the like, or annularly via circular slits, and the like. The scavenger flow J ascends inside the heating chamber 111 but outside of a workpiece enclosure 132 and a positioning assembly 122, and enters an exhaust hood 146 (flow Q).

The exhaust hood 146 serves to evacuate, or exhaust, gas from within the heating chamber 111 through a gas exhaust line 148 and out of the thermal processing apparatus 100 in the direction of arrow R. The gas exhaust line 148 can be connected to a number of different vacuum valves and vacuum pumps (not shown) to operate the heating chamber 111 at pressures ranging from zero up to a few atmospheric pressures. To control the pressure, the flow rates of the scavenger gases and process gases are regulated simultaneously, while controlling the gas evacuation rate from the heating chamber 111.

The flow direction of the scavenger gas can be reversed by supplying scavenger gas from a gas source 116 to the gas exhaust line 148 and exhausting gas through the gas inlet 114 (which would have to be re-configured to dispose of the exhausted gas). For applications that need low pressure or a vacuum, the scavenger gas flow rate can be set to zero.

The enclosure positioning assembly 122 mounts through the bottom of the heating chamber 111 and can extend upwardly and retract downwardly within the heating chamber 111. The enclosure positioning assembly 122 can couple to the heating chamber 111 via a gas bearing 125 or other known sealing technique, such as elastic seal, bellows, differential pumping, and the like, to ensure the gas integrity of the heating chamber 111. The enclosure positioning assembly 122 can be in the form of an elevator assembly for a vertical-type thermal processing apparatus as illustrated in FIG. 4. The positioning assembly 22 can also be arranged for use in a horizontal-type or other type of thermal processing apparatus.

The positioning assembly 122 of the illustrated embodiment in FIG. 4 includes an interior cavity 124, which provides an optical path or electrical wire path for a temperature sensor 144 located at the lower end of the positioning assembly 122. The interior cavity 124 of the positioning assembly 122 serves as the process exhaust passageway through the positioning assembly 122.

A thin tube 123 disposed inside the positioning assembly 122 serves as a gas passageway for process gases to flow along the positioning assembly 122 into the small volume workpiece enclosure 132. Process gases are introduced through a process gas inlet 121 from a gas supply 126. A thin tube 166 below a workpiece enclosure base 134 carries the process gases out of the positioning assembly 122 to an interface between a lid 133 and a base 134 of the workpiece enclosure 132. The process gas then enters a sub-compartment 162 of the lid 133 through an aperture 168 in the bottom of the lid 133 (flow S). The gas supply 126 can supply one or more kinds of gas simultaneously and/or sequentially. Multiple gas passageways can be incorporated into the enclosure positioning assembly 122 for different process gases.

A remote plasma can be used as the processing ambient inside the small volume workpiece enclosure 132 by employing an energizing device 127 coupled to the process gas inlet 121. The energizing device 127 can be a microwave (MW) cavity, a radio-frequency (RF) antenna or electrodes, DC discharge electrodes, or the like. The energizing device 127 can also be a photo-energizing cell to ionize and dissociate process gases prior to entering the workpiece enclosure 132. The photon sources can be laser beams, synchrotron radiation, lamps (VUV, UV-visible and IR light), and the like.

The small-volume workpiece enclosure 132 mounts at a top end of the positioning assembly 122. The small-volume workpiece enclosure 132 includes the lid 133 separated from the base 134. The lid 133 rests on the base 134 when the small-volume workpiece enclosure 132 resides at an elevated position within the heating chamber 111 as shown in FIG. 4.

The lid 133 has a double-wall structure including an outer wall 160 and an inner wall 161 that join at a bottom portion of the lid 133 to form a first (outer) sub-compartment 162 within the lid 133. At least one aperture 168 is disposed in the lid 133 and aligns with the process gas thin tube 166 of the base 134. The inner wall 161 has a plurality of apertures 135 allowing the process gas in the first (outer) sub-compartment 162 to propagate to a second (inner) sub-compartment 164 formed by the inner wall 161 of the lid 133 and the base 134.

The first (outer) sub-compartment 162 preheats the incoming process gas flow S before the process gas enters the second (inner) sub-compartment 164 through the shower head 135 to interact with a workpiece 130. The preheating of the process gas can be fine tuned by controlling the heat absorbing power at various portions of the lid 133.

A sealing arrangement between the lid 133 and the base 134 can be gas-tight. In practice, it suffices to provide a sufficient flow resistance to limit the percentage of gas escape or exchange through the gap between the contacting surfaces of the lid 133 and base 134. Employing a self-aligning feature 137 on the base 133, or other structures with the same function, ensures the alignment of the lid 133 with respect to the base 134.

A supporting device 136, such as tripod legs, extends from the lid 133 to below the bottom of the base 134 for loading and unloading the workpiece 130. When the enclosure positioning assembly 122 lowers sufficiently toward the base of the heating chamber 112, the supporting device 136 stands on the bottom of the heating chamber 112 and supports the lid 133. The lid 133 and the base 134 separate from each other when the enclosure positioning assembly 122 lowers an additional amount. Consequently, the interior portion of the small-volume workpiece enclosure 132 becomes accessible to a workpiece transfer device (not drawn) through a gate 131 in the lower section of the chamber 112.

The second (inner) sub-compartment of the small-volume workpiece enclosure 132 can include a gas diffuser 128. The gas diffuser 128 can have a window 140 formed therein. The gas diffuser 128 is disposed above the base 134 and below the workpiece 130. The workpiece 130 can be a semiconductor wafer or other type of workpiece. The workpiece 130 resides on supporting features 147 of the base 134 of the workpiece enclosure 132, which can be pins, sharp edges, flat surfaces, and the like. The workpiece 130 can be placed into and taken out of the small-volume workpiece enclosure 132 when the lid 133 is self-supported, and the base 134 is at its idle position to open a gap between the lid 133 and the base 134.

The gas diffuser 128 manipulates the gas flow pattern inside the small-volume workpiece enclosure 132, for example, by converging the process gas flow U from the edge to the center in the second (inner) sub-compartment 164, and into the interior cavity 124 of the positioning assembly 122 (flow V).

The gas diffuser 128 can serve as a thermal radiation reflector or compensator. The gas diffuser 128 reflects thermal radiation emitted and unabsorbed by the workpiece 130 back toward the workpiece 130 to compensate thermal radiation intensity loss due to the absorption and reflection by the lid 33 and the base 34. The reflective nature of the gas diffuser 128 can increase the temperature of the workpiece 130. The gas diffuser 128 can also reflect thermal radiation away from all or part of the workpiece 130 to achieve some temperature control and temperature uniformity of the workpiece 130.

The gas diffuser 128 includes a surface having one of a uniform reflectivity, or a varying reflectivity as a function of the location on the gas diffuser 128, to fine tune the temperature uniformity of the workpiece 130. The different or varying reflectivity levels of the gas diffuser 128 determine the amounts of the thermal radiation reflected toward different portions of the workpiece 130 to achieve the uniform heating of the workpiece 130.

The gas diffuser 128 can physically be split into two entities as described in the previous embodiment. The first serves as a gas diffuser to manipulate the gas flow pattern within the workpiece enclosure 132. The second serves as a thermal radiation reflector to regulate the thermal radiation received by the workpiece 130. Again, the thermal radiation reflector can be in the form of a reflective surface on the bottom surfaces of the base 134, while the diffuser is made of a material highly transparent to thermal radiation. More than one gas diffuser and thermal radiation reflector can also be placed about the workpiece enclosure 132.

A ring (not shown) can be placed around the edge of the workpiece 130 to selectively shield the edge from thermal radiation and prevent overheating along the edge. The ring can mount on supporting fingers protruding from the inner wall 161 of the lid 133. Alternatively, the optical transmittance in certain portions of the lid 133 can be rendered to selectively reduce the amount of thermal radiation received by the edge of the workpiece 130.

The temperature sensor 144 is located at a lower end of the enclosure positioning assembly 122 and external to the heating chamber 111. The temperature sensor 144 measures the temperature of the workpiece 130 during thermal processing. The temperature sensor 144 can be of non-contact type, e.g. a pyrometer, which requires an optical path, as provided by a window 140 of the gas diffuser 128 and the interior cavity 124 of the positioning tube 122.

The temperature sensor 144 can also be of contact type, e.g. a remote sensor with a temperature reading device or a thermocouple with a voltage-measuring device. The remote sensor and the thermocouple require a physical path for electric wires (not shown) to extend from the workpiece enclosure 130, through the enclosure positioning assembly 122, to the temperature reading device or the voltage-sensing device, as mentioned in the previous embodiment. The remote sensor or the thermocouple can make contact with the workpiece 130, or maintain a predetermined distance from the workpiece 130, to measure the temperature of the workpiece 130.

In accordance with the teachings of the present invention, a process gas or a sequence of different process gases from the process gas supply 126, can be introduced through the process gas inlet 121. The process gas flow can be energized by the energizing device 127 to yield a plasma using electromagnetic fields, or a gas medium containing electron, ions and radicals using various photon sources. The process gas (or plasma) flow ascends along the gas supply line 123 and the thin tube 166 to the interface between the lid 133 and the base 134. The process gas enters the first (outer) sub-compartment 162 (flow S) through an aperture 168.

The process gas is preheated inside the first (outer) compartment 162 and enters the second (inner) sub-compartment 164 via a plurality of apertures 135 in a showerhead-type configuration. The process gas flow spreads over and interacts with the surfaces of the workpiece 130 (flow T), and flows downward and around the gas diffuser 128 (flow U). The process gas proceeds through a gap between the gas diffuser 128 and the base 134 to converge into the interior cavity 124 of the positioning assembly 122 (flow V). The process gas passes through the positioning assembly 122 (flow W) and exits the entire heating chamber 111 via a process gas outlet 170 (flow X and Y). The flow rate of the process gas can be used to partially regulate the overall temperature and the temperature uniformity of the workpiece 130 through thermal convection and conduction.

In this embodiment as illustrated in FIG. 4, the process gas flow route (through process gas inlet 121, gas supply line 123 to thin tube 166 and flows S, T, U, V, X to Y) is completely separate from the flow of the scavenger gas (flows J, Q, and R). Unlike the previous embodiment (FIG. 1 and FIG. 2) which exhausts the process gas into the heating chamber 11, the process gas is directly exhausted out of the heating chamber 111 in this embodiment. This allows the use of incompatible process gases in a consecutive manner during a multiple step RTP processing cycle.

The process gas flows in the direction of arrows V, W, and X in the interior cavity 124 of the positioning assembly 122 overlap with the optical path of the remote temperature sensor 144. Many process gases absorb thermal radiation at wavelengths used by the remote temperature sensor 144, causing severe interference to the temperature measurement of the workpiece 130. This problem can be solved by still another embodiment of the present invention as illustrated in FIG. 5, in which the optical path of a remote temperature sensor is separate from the process gas route.

With reference to FIG. 5, a lid 233 of a workpiece enclosure 232 is similar to the lid 133 of the previous workpiece enclosure 132. The process gas flow is introduced into a first (outer) sub-compartment 262 (formed by an outer wall 260 and an inner wall 261) through an aperture 268 in a bottom portion of the lid 233. A process gas input opening in the base 234 aligns with the aperture 268 in the bottom of the lid 233. A process gas input line consists of an input tube 223 and a bridge tube 266. Support features 236 also exist to facilitate the separation of the lid 233 from the base 234 for loading and unloading of a workpiece 230.

The base 234 of the workpiece enclosure 232 differs substantially from the base 134 of the previous workpiece enclosure 132 of the previous embodiment. The workpiece 230 itself forms a wall section forming a second (inner) sub-compartment 264. In other words, the second (inner) sub-compartment 264 is formed by the inner-wall 261 of the lid 233, the base 234, and the workpiece 230. A vertical and circular wall 246 supports the workpiece 230, providing a sufficient flow resistance to limit the gas exchange between the second (inner) sub-compartment 264 and the heating chamber 111. A self-aligning feature 237 ensures alignment between the lid 233 and the base 234 when the two sections of the enclosure 232 meet.

Process gases enter the second (inner) sub-compartment 264 from the first (outer) sub-compartment 262 via apertures 235 forming a gas showerhead. An edge ring 243 mounts around the workpiece 230. The edge ring 243, the vertical and circular wall 246, and the bottom of the base 234, form a circular tunnel to receive process gas after interacting with the top surface of the workpiece 230. Process gas exits the second (inner) sub-compartment 264 at one or more apertures 254 and propagates through one or more exhaust tubes 256.

In conjunction with using the workpiece 230 as a wall section for the inner sub-compartment 264, a reflector 228 (or gas diffuser) and an optical window 240 mount outside the inner sub-compartment 264 and atop a positioning assembly 222. The vertical segments of the input tube 223 and a gas output tube 258 are disposed inside the positioning assembly 222. The input tube 223 and the gas output tube 258 can couple to, or incorporate into, the enclosure positioning assembly 222. A purge gas for an optical path flows along an axis of an interior cavity 224 of the positioning assembly 222 upward to the optical window 240. Some purge gas passes through the gap between the optical window 240 and the reflector 228 to purge the region between the workpiece 230 and the reflector 228. This configuration substantially reduces the quantity of process gas present along the optical path of a non-contact temperature sensor viewing the bottom of the workpiece 230.

The double-wall structure employed in the two lids 133 and 233 of the two workpiece enclosure embodiments 132 and 232 in FIGS. 4 and 5, respectively, may limit the highest achievable temperature for a workpiece due to the further reduction in thermal radiation transmission resulting from an additional layer of wall material. FIG. 6 illustrates still another embodiment of a workpiece enclosure 332 having a single wall lid 333 and a reflector 328 external to a processing (inner) sub-compartment 364. Process gases ascend in a vertical segment of a gas inlet tube 323 contained inside a positioning assembly 322. The process gas exits the positioning assembly 322 through a horizontal bridging tube 366 to enter a circular gas tunnel 368 of an enclosure base 334. The circular tunnel 368 evenly distributes the process gas flow around the periphery of a workpiece 330. The process gas passes through one or more apertures, or narrow slits, 370 in the base plate 334 to enter the processing (inner) sub-compartment 364.

Similar to the previous embodiment, the enclosure lid 333, the base 334, and the workpiece 330, form the processing (inner) sub-compartment 364. The workpiece 330 is supported along its periphery by a vertical and circular wall 346 to form a sufficient flow resistance to gas exchange between the enclosed space 364 and a heating chamber in which the workpiece enclosure 322 resides. The process gas flows over an edge ring 343 and toward the center of the workpiece 330 to interact with a top surface of the workpiece 330.

The process gas converges into a hood 376 of a U-shaped thin exhaust tube 357. The hood 376 is disposed above the center of the workpiece 330 and just below the lid 333. The U-shaped thin tube 357 can be welded through the base 334. Gas exhausted through the hood 376 enters the exhaust tube 357 contained inside the positioning assembly 322. The process gas flows through the positioning assembly 322 and exits the entire system via the enclosure positioning assembly 322.

To prevent process gas from interfering with a non-contact temperature sensor, a non-absorptive purge gas flow is used to purge the optical path through an interior cavity 324 of the positioning assembly 222. The diameter of the U-shaped exhaust tube 357 is as small as possible for a desired volume and rate of gas flow, and its elevation above the workpiece 330 is sufficiently high to minimize it's effect on the uniform heating of the workpiece 330. An optical window 340 provides an optical path for obtaining temperature readings of the workpiece 330 as previously described.

Support features 336 also exist to facilitate the separation of the lid 333 from the base 334 for loading and unloading of the workpiece 330. A self-aligning feature 337 promotes alignment between the lid 333 and the base 334 when the two sections of the enclosure 332 meet.

The small volumes of the small-volume workpiece enclosures relative to the volume of a heating chamber substantially reduce the quantities of the process gases flowing around the workpieces. Thus, process gas ambient around a workpiece can be purged and switched much more quickly (e.g. less than a few seconds) than without using a workpiece enclosure. This dramatically improves the thermal processing throughput. The small volume of the workpiece enclosure significantly reduces the quantities of hazardous process gases contained inside a thermal processing system and greatly reduces the safety risks. The use of a small volume enclosure provides the multiple-step thermal processing capabilities for a workpiece involving multiple process gases synchronized with the processing temperature profiles of the workpieces, while still preserving the performance advantages of the existing thermal processing systems.

Numerous modifications and alternative embodiments of the invention will be apparent to those skilled in the art in view of the foregoing description. Accordingly, this description is to be construed as illustrative only and is for the purpose of teaching those skilled in the art the best mode for carrying out the invention. Details of the structure may vary substantially without departing from the spirit of the invention, and exclusive use of all modifications that come within the scope of the appended claims is reserved. It is intended that the invention be limited only to the extent required by the appended claims and the applicable rules of law.

What is claimed is:

1. A thermal processing apparatus for processing a workpiece, comprising:
   a heating chamber;
   a small-volume workpiece enclosure disposed about said workpiece; and
   a positioning assembly supporting said small-volume workpiece enclosure for moving said small-volume workpiece enclosure and said workpiece within said heating chamber
   wherein a ratio of the volume of said heating chamber to the volume of said small-volume workpiece enclosure is greater than about two.

2. The thermal processing apparatus of claim 1, wherein said heating chamber comprises at least one of a thermal radiation intensity gradient and a temperature gradient for thermally processing said workpiece.

3. The thermal processing apparatus of claim 1, further comprising heating elements disposed about said heating chamber.

4. The thermal processing apparatus of claim 1, wherein said furnace includes a bell jar forming said heating chamber.

5. The thermal processing apparatus of claim 1, further comprising a gas supply coupled to said small-volume workpiece enclosure for introducing one or more gases into said small-volume workpiece enclosure.

6. The thermal processing apparatus of claim 5, further comprising a heating mechanism for pre-heating said gas supply and said gases.

7. The thermal processing apparatus of claim 5, further comprising a gas diffuser disposed within said small-volume workpiece enclosure for regulating a flow of said gas within said small-volume workpiece enclosure.

8. The thermal processing apparatus of claim 7, wherein said gas diffuser at least partially regulates the temperature of said workpiece.

9. The thermal processing apparatus of claim 7, wherein said gas diffuser is formed of one of quartz, quartz fiber, ceramic, silicon carbide, and sapphire materials.

10. The thermal processing apparatus of claim 7, wherein said gas diffuser has a reflective surface that reflects thermal radiation unabsorbed by said workpiece to at least partially regulate the temperature of said workpiece.

11. The thermal processing apparatus of claim 10, wherein said reflective surface has a uniform reflectivity.

12. The thermal processing apparatus of claim 10, wherein said reflective surface has a non-uniform reflectivity.

13. The thermal processing apparatus of claim 7, where said gas diffuser has a surface with a reflectivity being one of uniform and varying as a function of a location on said diffuser to effect temperature uniformity of said workpiece.

14. The thermal processing apparatus of claim 13, wherein said gas diffuser is adapted to uniformly heat the workpiece.

15. The thermal processing apparatus of claim 7, wherein said gas diffuser is adapted to pre-heat a gas flowing through said small-volume workpiece enclosure.

16. The thermal processing apparatus of claim 7, further comprising a window formed within said gas diffuser.

17. The thermal processing apparatus of claim 7, further comprising:
   a window within said gas diffuser;
   a temperature sensor disposed relative to said workpiece; and
   a mounting device for positioning said workpiece within said small-volume workpiece enclosure;
   wherein said window provides an optical path for said temperature sensor to attain a temperature of said workpiece.

18. The thermal processing apparatus of claim 1, wherein said small-volume workpiece enclosure is formed of at least a first section and a second section.

19. The thermal processing apparatus of claim 18, further comprising at least one support structure coupled to said first section of said small-volume workpiece enclosure, such that when said small-volume workpiece enclosure is lowered to a base of said thermal processing apparatus, said at least one support structure supports said first section of said small-volume workpiece enclosure and said second section of said small-volume workpiece enclosure separates from said first section, allowing loading and unloading of said workpiece into and out of said small-volume workpiece enclosure.

20. The thermal processing apparatus of claim 1, further comprising a temperature sensor disposed relative to said workpiece for determining the temperature of said workpiece.

21. The thermal processing apparatus of claim 20, wherein said temperature sensor comprises a pyrometer.

22. The thermal processing apparatus of claim 20, wherein said temperature sensor comprises a thermocouple.

23. The thermal processing apparatus of claim 1, further comprising at least one aperture formed in a wall of said small-volume workpiece enclosure, such that gas supplied to said small-volume workpiece enclosure can escape through said at least one aperture.

24. The thermal processing apparatus of claim 1, further comprising means disposed within said heating chamber for exhausting gas from said heating chamber.

25. The thermal processing apparatus of claim 1, wherein said small-volume workpiece enclosure is made of material at least partially transparent to thermal radiation.

26. The thermal processing apparatus of claim 1, wherein said small-volume workpiece enclosure is made of material that is one of reflective, semi-transparent, and opaque to thermal radiation.

27. The thermal processing apparatus of claim 1, wherein said small-volume workpiece enclosure contains one or more thermal radiation shields, reflectors, and optical components, disposed about said workpiece to regulate the temperature of said workpiece.

28. The thermal processing apparatus of claim 1, wherein said positioning assembly comprises at least one of a gas input conduit for supplying gas and a gas exhaust conduit for exhausting gas.

29. The thermal processing apparatus of claim 1, wherein said positioning assembly contains at least one path between said workpiece and a temperature sensor, for radiation emitted from said workpiece and at least one thermal radiation source.

30. The thermal processing apparatus of claim 29, wherein said path for radiation can be purged with gas that does not absorb thermal radiation.

31. The thermal processing apparatus of claim 1, wherein said positioning assembly contains at least one path between said workpiece and a temperature sensor, for an electrical signal to pass.

32. The thermal processing apparatus of claim 1, further comprising an energizing device for energizing process gases prior to entering the small volume workpiece enclosure.

33. A method of thermally processing a workpiece, comprising the steps of:
   providing a heating chamber for thermally processing said workpiece;
   placing said workpiece into a small-volume workpiece enclosure within said heating chamber;
   heating said heating chamber and said small-volume workpiece enclosure;
   positioning said small-volume workpiece enclosure within said heating chamber; and
   thermally processing said workpiece.
   wherein a ratio of the volume of the heating chamber to the volume of the small-volume workpiece enclosure is greater than about two.

34. The method of claim 33, wherein said step of thermally processing at least partially comprises positioning said small-volume workpiece enclosure within one or more locations of the thermal processing apparatus as required to control heating levels applied to said workpiece.

35. The method of claim 33, wherein said step of thermally processing at least partially comprises supplying said small-volume workpiece enclosure with a gas to at least partially regulate heating of said workpiece.

36. The method of claim 35, further comprising pre-heating said gas prior to supplying said gas to said workpiece.

37. The method of claim 35, wherein the step of supplying said small-volume workpiece enclosure with a gas comprises regulating a flow of said gas through a diffuser.

38. The method of claim 35, wherein said step of heating said heating chamber comprises the step of activating at least one heating element.

39. The method of claim 38, wherein the step of activating at least one heating element produces thermal radiation and generates at least one of a thermal radiation gradient and a temperature gradient.

40. The method of claim 38, wherein the step of activating at least one heating element comprises activating a plurality of heating elements disposed relative to said heating chamber.

41. The method of claim 38, wherein the step of activating at least one heating element comprises activating a plurality of heating elements disposed within a bell jar.

42. The method of claim 33, further comprising the step of removing said workpiece from said heating chamber of said small-volume workpiece enclosure within said thermal processing apparatus.

43. The method of claim 33, further comprising the step of exhausting said gas from said small-volume workpiece enclosure into said thermal processing apparatus.

44. The method of claim 33, further comprising the step of venting said thermal processing apparatus to exhaust gases released from said small-volume workpiece enclosure.

45. The method of claim 33, further comprising the step of maintaining desired ambient pressures within said small-volume workpiece enclosure and said rapid thermal processing apparatus.

46. The method of claim 35, wherein the step of supplying said small-volume workpiece enclosure with a gas comprises energizing a flow of said gas to yield at least one of a plasma and a gas containing electrons, ions, radicals and energetically excited species.

47. The method of claim 35, further comprising the step of exhausting said gas through an exhaust line from said small-volume workpiece enclosure.

48. The method of claim 35, further comprising the step of exhausting said gas to said heating chamber from said small-volume workpiece enclosure to purge said gas from said small-volume workpiece enclosure.

49. A thermal processing apparatus for processing a workpiece, said thermal processing apparatus comprising a heating chamber having at least one of a thermal radiation intensity gradient and a temperature gradient, a small-volume workpiece enclosure disposed about said workpiece, and a positioning assembly supporting said small-volume workpiece enclosure for moving said small-volume workpiece enclosure and said workpiece to desired locations within said heating chamber, wherein a ratio of the volume of the heating chamber to the volume of the small-volume workpiece enclosure is greater than about two, said thermal processing apparatus capable of performing one or more of:

dry and wet rapid thermal oxidation;

rapid thermal nitridation;

rapid thermal anneal for implant diffusion and metal silicides formulation;

rapid thermal BPSG reflow;

selective oxidation of Si in the presence of metal;

rapid thermal chemical vapor deposition;

low pressure chemical vapor deposition;

metal-organic chemical vapor deposition;

remote-plasma chemical vapor deposition; and multi-layer dielectric gate stack formation.

* * * * *